United States Patent [19]

Nozaki

[11] Patent Number: 5,119,335
[45] Date of Patent: Jun. 2, 1992

[54] SEMICONDUCTOR STATIC MEMORY DEVICE

[75] Inventor: Shigeki Nozaki, Kuwana, Japan

[73] Assignee: Fujitsu Limited, Kawasaki, Japan

[21] Appl. No.: 711,402

[22] Filed: Jun. 5, 1991

Related U.S. Application Data

[63] Continuation of Ser. No. 400,210, Aug. 29, 1989, abandoned.

[30] Foreign Application Priority Data

Sep. 2, 1988 [JP] Japan .................... 63-221152

[51] Int. Cl.⁵ .............................. G11C 7/00
[52] U.S. Cl. ............................. 365/190; 365/189.11
[58] Field of Search .......... 365/154, 189.09, 189.11, 365/190, 202, 203

[56] References Cited

U.S. PATENT DOCUMENTS

| | | | |
|---|---|---|---|
| 3,995,215 | 11/1976 | Chu | 324/158 R |
| 4,122,549 | 10/1978 | Kinoshita | 365/205 |
| 4,551,641 | 11/1985 | Pelley, III | 365/205 |
| 4,739,499 | 4/1988 | Simpson | 365/205 |

FOREIGN PATENT DOCUMENTS

| | | |
|---|---|---|
| 0080935 | 6/1983 | European Pat. Off. . |
| 0090632 | 10/1983 | European Pat. Off. . |
| 0192121 | 8/1986 | European Pat. Off. . |
| 0271283 | 6/1988 | European Pat. Off. . |

OTHER PUBLICATIONS

Patent Abstract of Japan vol. 12, No. 359 (P-762) Sep. 27, 1988.

*Primary Examiner*—Joseph A. Popek
*Attorney, Agent, or Firm*—Armstrong, Nikaido, Marmelstein, Kubovcik & Murray

[57] ABSTRACT

A semiconductor memory device including a pair of bit lines, a memory cell provided between the pair of bit lines, and a potential difference control device connected to the pair of bit lines. The bit lines include a potential difference therebetween when information stored in the memory cell is read out. The potential difference control device has a transistor control for receiving a first control signal and for responding thereto; thereby, increasing the potential difference between the pair of bit lines up to a predetermined level so as to provide a high speed read-operation and to reliably discriminate a "good" or a "no good" reading when subjected to a screening test.

17 Claims, 9 Drawing Sheets

PRIOR ART
Fig.2A ADDRESS SIGNAL
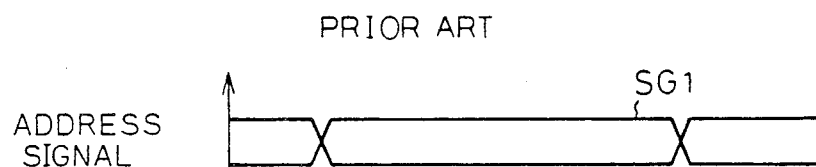
Fig.2B ATD SIGNAL
Fig.2C POTENTIAL AT WORD LINE WL
Fig.2D POTENTIAL AT COLUMN LINE CL
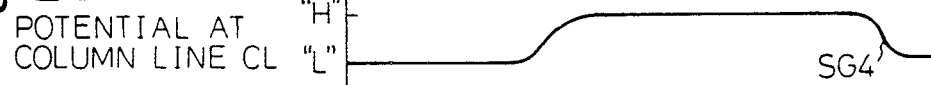
Fig.2E POTENTIAL AT BIT LINE
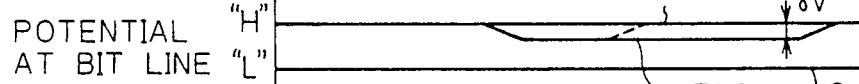
Fig.2F RESET SIGNAL
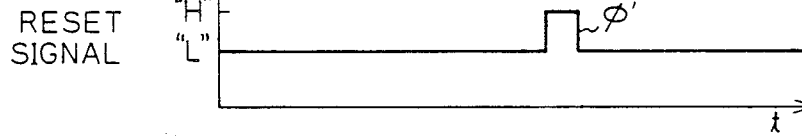

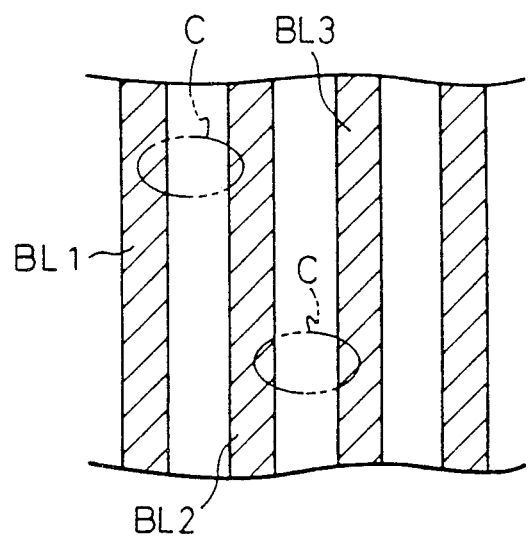

Fig.5A ADDRESS SIGNAL
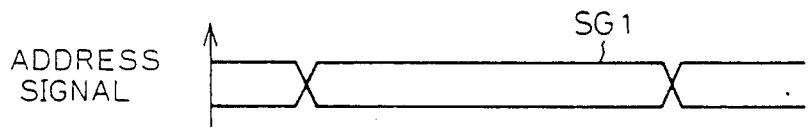
Fig.5B ATD SIGNAL
Fig.5C POTENTIAL AT WORD LINE WL
Fig.5D POTENTIAL AT COLUMN LINE CL
Fig.5E GATE SIGNAL
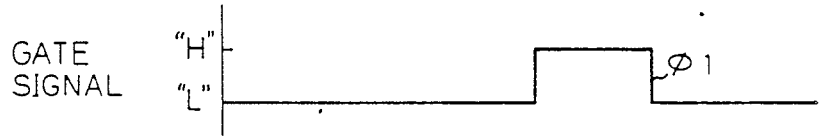
Fig.5F POTENTIAL AT BIT LINE
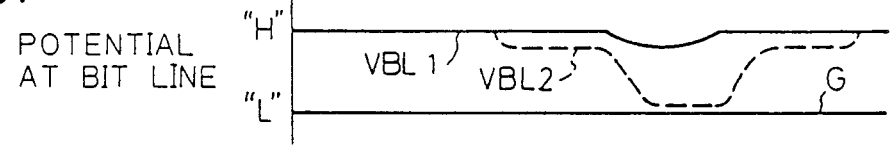
Fig.5G POTENTIAL AT NODE BLG
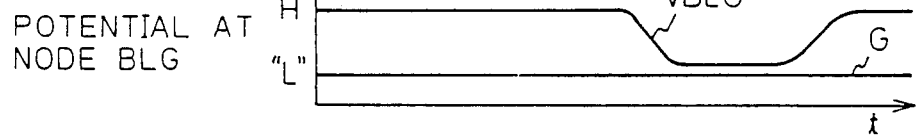

SEMICONDUCTOR STATIC MEMORY DEVICE

This application is a continuation of application Ser. No. 400,210 filed Aug. 29, 1989, now abandoned.

BACKGROUND OF THE INVENTION

1. Field of the Invention

The present invention relates to a semiconductor memory device, and more particularly, to a technique of effecting a screening of a static random access memory (SRAM).

2. Description of the Related Art

With a recent demand for a high speed operation and large capacity of computer systems, the degree of integration of semiconductor memory devices constituting a computer system has been increasingly heightened and the operation speed thereof has also been increased. In such semiconductor memory devices, a screening test for rejecting or removing products having latent defects is carried out to prevent their initial failures. For example, with respect to SRAM devices as semiconductor memory devices constituting a computer system, the screening test is carried out using a burn-in apparatus, in which a power supply voltage higher than a normal voltage used in a read/write operation is applied across a pair of bit lines in each device.

On the other hand, a known typical SRAM device is constituted such that, when information is read out from a selected memory cell, a potential difference between a pair of bit lines corresponding to the memory cell is made small. This is intended to increase the read speed of information.

Accordingly, where such SRAM devices are subject to the above screening test, a problem occurs in that it is difficult or impossible to reject semiconductor memory devices having latent defects as "no good". This can occur, for example, in the case that electrically conductive foreign materials, the surface of which being oxidized, such as aluminium (Al) crumbs, silicon (Si) crumbs or the like resulting from the process of constructing the SRAM device remain adhering to a pair of complementary bit lines or a pair of bit lines across adjacent cells. Namely, since the potential difference between the pair of complementary bit lines is selected to be small to realize an increase in the information read speed, it is difficult to apply a sufficiently high voltage stress to the electrically conductive foreign materials even if a higher power supply voltage than the normal voltage is applied to the device in the screening test. As a result, it becomes impossible to reject the "no good" device with height reliability.

SUMMARY OF THE INVENTION

An object of the present invention is to provide a semiconductor memory device which can be adapted for a reliable discrimination of "good" or "no good" in a screening test, while realizing a high speed rad operation. According to the present invention, there is provided a semiconductor memory device including: a pair of bit lines; a memory cell provided between the pair of bit lines, the bit lines having a potential difference there between when information stored in the memory cell is read out; and a potential difference control unit, operatively connected to the pair of bit lines, for increasing the the potential difference between the pair of bit lines up to a predetermined level in response to a first control signal.

BRIEF DESCRIPTION OF THE DRAWINGS

Other objects and features of the present invention will be described hereinafter in detail by way of preferred embodiments with reference to the accompanying drawings, in which:

FIGS. 2A to 2F are timing charts for explaining an operation of the circuit shown in FIG. 1;

FIG. 3 is a view showing a state in which electrically conductive foreign materials remain adhering to bit lines;

FIGS. 5A to 5G are timing charts for explaining an operation of the circuit shown in FIG. 4;

DESCRIPTION OF THE PREFERRED EMBODIMENTS

For a better understanding of the preferred embodiments of the present invention, the problem in the prior art will be explained with reference to FIGS. 1 to 3. As indicated above, FIG. 3 is a view showing a state wherein electrically conductive foreign materials adhere to bit lines. As further discussed above, it is difficult in the prior art to apply a sufficiently high voltage stress to the electrically conductive foreign materials even if a higher power supply voltage than the normal voltage is applied to the device in the screening test. Note, in the following description, the term "transistor" indicates an n-channel metal oxide semiconductor (MOS) transistor so long as a specific definition is not added thereto.

Figure 1:
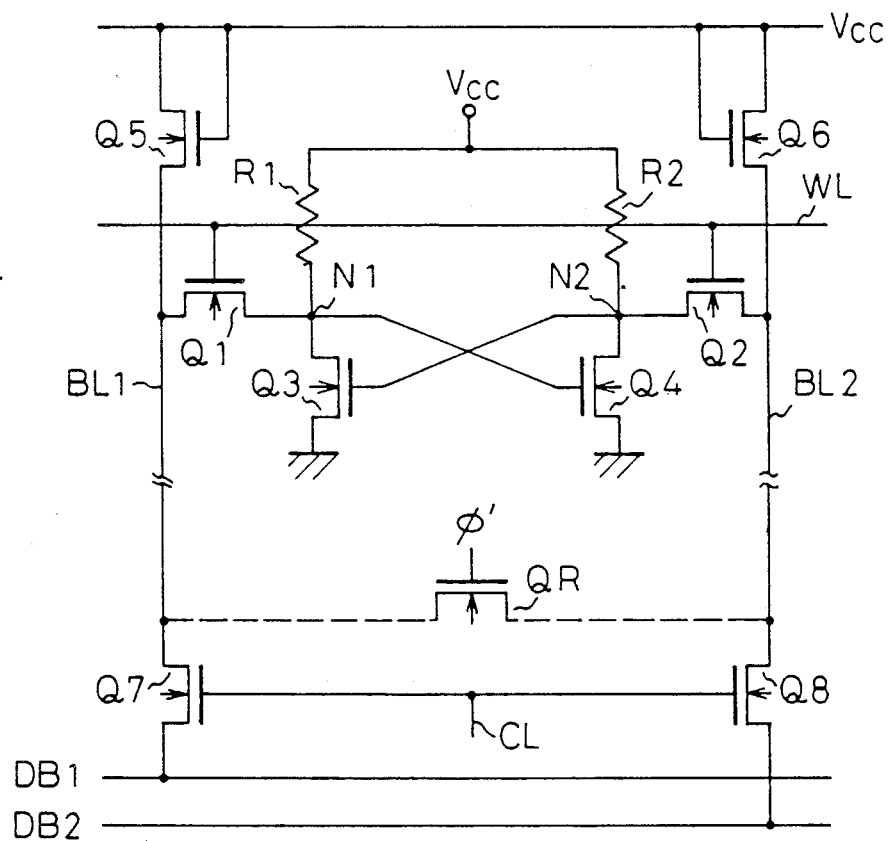
FIG. 1 is a circuit diagram illustrating a constitution of one column in a prior art SRAM device.

FIG. 1 shows a circuit constitution of one column in a prior art SRAM device, and FIGS. 2A to 2F show operation timing charts of the circuit.

A memory cell illustrated in FIG. 1 includes a flip-flop circuit as a basic constituent element. The flip-flop circuit is constituted by a pair of resistors R1,R2 as a load and a pair of transistors Q3,Q4 as a driver. In a data write operation, one of the transistors Q3,Q4 is turned ON and another thereof is turned OFF. As a result, one of the potentials at a connection point N1 between the resistor R1 and transistor Q3 and a connection point N2 between the resistor R2 and transistor Q4 settles to "H" level, and another thereof settles to "L" level. The "H" level and "L" level states are stably kept in the SRAM cell while the cell is in a non-selection state.

In a data read operation, an address signal SG1 (see FIG. 2A) is changed to select the memory cell and a change thereof is detected in a chip to form an address transition detect (ATD) signal SG2 (see FIG. 2B). In response to this ATD signal S52, a potential at a word line WL (gate signal SG3) is raised to "H" level (see FIG. 2C), and a potential at a column line CL (gate signal SG4) is also raised to "H" level (see FIG. 2D). As a result, the transistors Q1, Q2, Q7 and Q8 are turned ON and, accordingly, the above cell information stored in the memory cell is read via the transistors Q1, Q2, a pair of bit lines BL1,BL2 and the transistors Q7, Q8 to a pair of data bus lines DB1, DB2.

Also, on the opposite side of the bit lines BL1,BL2 with respect to the data bus lines DB1,DB2, a higher voltage power supply line Vcc is connected via transistors Q5, Q6 to the bit lines BL1,BL2, respectively. When both the potential at the word line WL (gate signal SG3) and the potential at the column line CL (gate signal SG4) are at "L" level, i.e., when the SRAM cell is in the non-selection state, potentials VBL1,VBL2 at the bit lines BL1,BL2 are maintained at "H" level by the turn-ON of the transistors Q5,Q6 (see FIG. 2E). It is assumed that the connection point N1 is at "H" level and the connection point N2 is at "L" level. When the gate signal SG3 is raised to "H" level and the cell information is then read out from the selected memory cell, the potential VBL1 at the bit line BL1 is maintained at "H" level and the potential VBL2 at the bit line BL2 is pulled down. In this case, by the operation o the transistors Q2, Q4 and Q6, the potential VBL2 is not pulled down to a ground potential G, but is brought to a potential lower than the potential VBL1 by a threshold voltage of the transistor Q6. This threshold voltage is indicated by reference $\delta V$ in FIG. 2E.

Namely, when the cell information is read out from the selected memory cell, the potential difference $\delta V$ between the pair of bit lines BL1,BL2 corresponding to the memory cell is controlled to be small. Therefore, it is possible to easily equalize the potentials of the pair of bit lines BL1,BL2 and to prepare the next reading of information. This leads to an increase in the information read speed as an entire SRAM device.

Accordingly, where the screening of the SRAM device is carried out by means of a burn-in apparatus, the potential difference between the bit lines BL1,BL2 is controlled to be small even if a higher power supply voltage (approximately 7 V) than a normal voltage (5 V) is applied to the device. For example, as shown in FIG. 3, where electrically conductive foreign materials C, the surface of which being oxidized, such as aluminium (Al) crumbs, silicon (Si) crumbs or the like resulting from the process of constructing the SRAM device remain adhering to the pair of complementary bit lines BL1,BL2 or the pair of bit lines BL2,BL3 across adjacent cells, it becomes difficult to apply a sufficient high voltage stress to the electrically conductive foreign materials C. Therefore, a drawback arises in that it is impossible to reliably reject a semiconductor memory device potentially having latent defects as a "no good" device.

Also, as another approach to the increase in the information read speed as an entire device, there is known a constitution in which, as shown in FIG. 1 by a broken line, a transistor QR responsive to a reset signal $\phi'$ is provided between the pair of bit lines BL1,BL2. In this case, immediately after the SRAM cell is selected and information is read out from the selected cell, the gate signal SG3 on the word line WL is lowered to "L" level (see FIG. 2C, a broken line) and, at the same time, the potentials VBL1,VBL2 on the pair of bit lines BL1,BL2 are equalized or reset to "H" level by the "H" level reset signal $\phi'$ (see FIG. 2E, a broken line, and FIG. 2F).

Although this approach has an advantage in that the potentials of the pair of bit lines BL1,BL2 are equalized more promptly for preparation of the next reading of information, it has a problem similar to the aforementioned approach in that it is impossible to apply a sufficient high voltage stress to the electrically conductive foreign materials remaining across the pair of bit lines and to reject a "no good" device.

Next, preferred embodiments of the present invention will be explained with reference to FIGS. 4 to 11.

Figure 4:
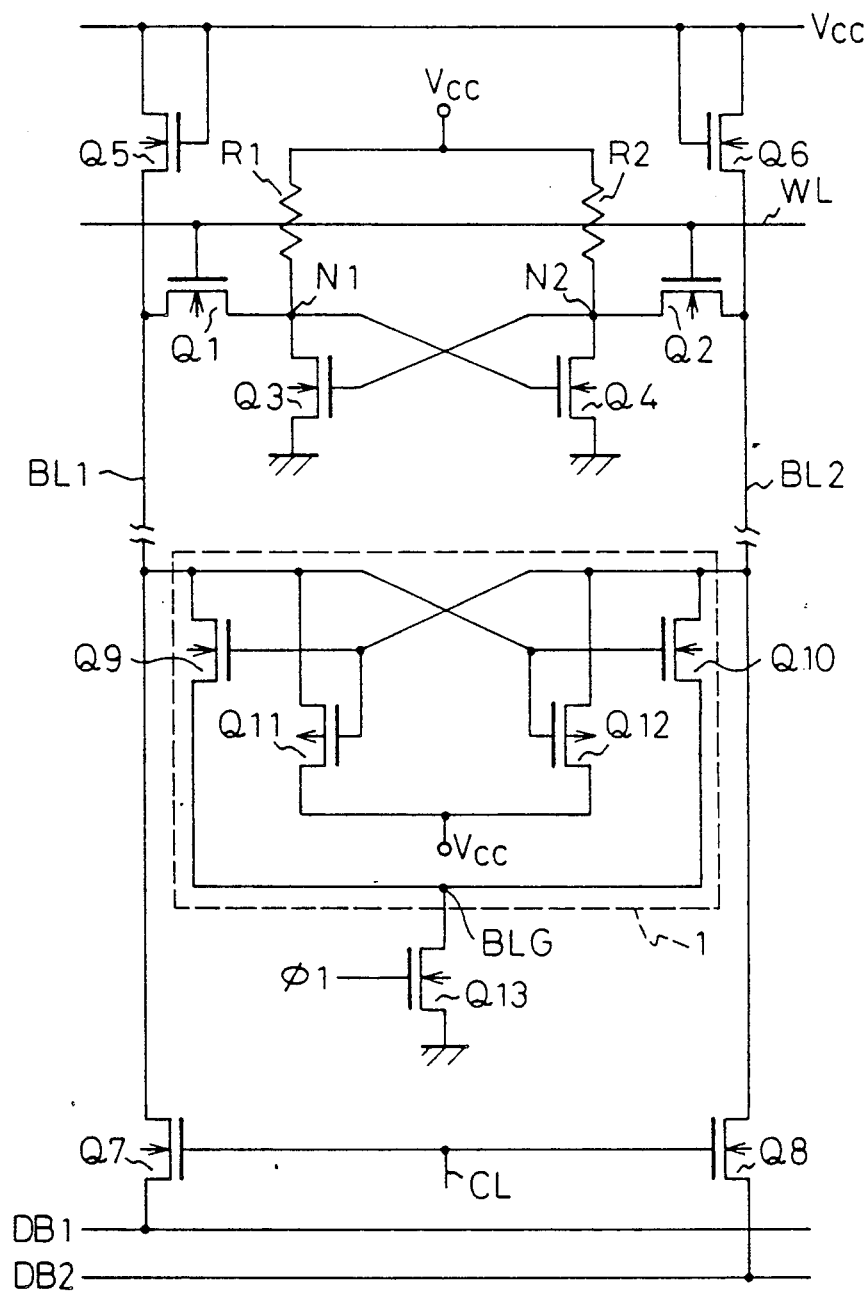
FIG. 4 is a circuit diagram illustrating a constitution of one column in a SRAM device as an embodiment of the present invention.

FIG. 4 illustrates a circuit constitution of one column in a SRAM device as an embodiment of the present invention. Note, since the constitution of the illustrated memory cell and the circuit for reading information therefrom is the same as that in FIG. 1, the explanation thereof will be omitted.

The circuit constitution illustrated in FIG. 4 is characterized in that a flip-flop circuit 1 consisting of two transistors Q9,Q10 and two p-channel MOS transistors Q11,Q12 is provided between the pair of bit lines BL1,BL2 constituting one column to which a plurality of memory cells are connected, and that a transistor Q13 as a gate means is connected between the flip-flop circuit 1 and the ground and receives a gate signal $\phi 1$ for activating the flip-flop circuit 1.

A drain, a gate and a source of the transistor Q9 are connected to the bit line BL1, the bit line BL2 and a drain of the transistor Q13, respectively, and a drain, a gate and a source of the transistor Q10 are connected to the bit line BL2, the bit line BL1 and the drain of the transistor Q13, respectively. Each source of the transistors Q11,Q12 is connected to the power supply line Vcc. A drain and a gate of the transistor Q11 are connected to the bit line BL1 and the bit line BL2, respectively, and a drain and a gate of the transistor Q12 are connected to the bit line BL2 and the bit line BL1, respectively. Also, a source of the transistor Q13 is grounded and a gate thereof receives the gate signal $\phi 1$ (see FIG. 5E) in a burn-in test.

Next, the operation, under the burn-in test, of the SRAM having the circuit constitution shown in FIG. 4 will be explained with reference to timing charts of FIGS. 5A to 5G.

Assuming that information is written in the above SRAM cell and, for example, the potential at the connection point N1 of a certain memory cell is settled to "H' level and the potential at the connection point N2 thereof is settled to "L" level.

In this state, when the address signal SG1 (see FIG. 5A) is changed to selected the memory cell and the change thereof is detected to form the ATD signal SG2 (see FIG. 5B), the gate signal SG3 on the word line WL and the gate signal SG4 on the column line CL are both raised to "H" level (see FIGS. 5C and 5D), so that the transistors Q1, Q2, Q7 and Q8 are turned ON. As a result, the "H" level information at the connection point N1 is output via the transistor Q1, the bit line BL1, and the transistor Q7 to the corresponding data bus line DB1, and the "L" level information at the connection point N2 is output via the transistor Q2, the complementary bit line BL2, and the transistor Q8 to the corresponding complementary data bus line DB2. At this time, the potential VBL2 on the bit line BL2 is brought to a potential lower than the potential VBL1 on the bit line BL1 by the threshold voltage of the transistor Q6. This threshold voltage is approximately one volt.

Therefore, in this state, the transistors Q9 and Q10 are both brought to the ON state and a potential VBLG at node BLG between the drain of the transistor Q13 and each source of the transistors Q9,Q10 settles to "H" level.

In the burn-in test, when the "H" level gate signal $\phi$ 1 (see FIG. 5E) is applied to the gate of the transistor Q13, the transistor Q13 is turned ON and, accordingly, the potential VBLG at node BLG is pulled down to the ground potential as shown in FIG. 5G. As a result, a drain current flows through each transistor Q9, Q10. In this case, since the the potential VBL1 is higher than the potential VBL2, more drain current flows through the transistor Q10 than through the transistor Q9. Namely, the transistors Q9 and Q10 function so that the difference between each drain current is enlarged.

Therefore, as shown in FIG. 5F, the potential VBL1 at the bit line BL1 is settled to "H" level nearly equal to the power supply voltage Vcc and the potential VBL2 at the bit line BL2 is settled to "L" level nearly equal to the ground level G. Note, the transistors Q11,Q12 function so that they promote the above functions of the transistors Q9,Q10.

When the gate signal $\phi$ 1 of the transistor Q13 is returned to "l" level, the transistor Q13 is turned OFF and, accordingly, the potential difference between the bit lines BL1,BL2 is returned to the potential difference (approximately 1 volt) at which the normal read operation of cell information is carried out. When the gate signal SG3 on the word line WL and the gate signal SG4 on the column line CL are then lowered to "L" level, the potentials VBL1,VBL2 on the bit lines BL1,BL2 settle to "H" level due to the turn-ON of the transistors Q5,Q6.

As explained above, in the screening test by means of a burn-in apparatus, it is possible to increase the potential difference (VBL1~VBL2) between the bit lines BL1,BL2 up to the potential difference between the power supply voltage Vcc and the ground potential by applying the "H" level gate signal $\phi$ 1 to the transistor Q13. Thus, since the sufficient voltage stress of approximately 7 V can be applied to the pair of bit lines in the burn-in test, it is possible to reliably reject a "no good" SRAM device potentially having latent defects.

Also, in the normal use of the SRAM device, it is possible to reduce the potential difference between the bit lines BL1,BL2 to approximately one volt (1 V) by keeping the gate signal $\phi$ 1 at "L" level and, accordingly, increase the information read speed.

According to the embodiment of FIG. 4, when the "H" level gate signal $\phi$ 1 is applied to the transistor Q13 and the potential VBL2 at the bit line BL2 is lowered to approximately the ground level G, a direct current flows from the power supply line Vcc via the transistors Q6,Q10 and Q13 to the ground. The direct current can be removed by adopting, for example, the circuit constitution shown in FIG. 6.

Figure 6:
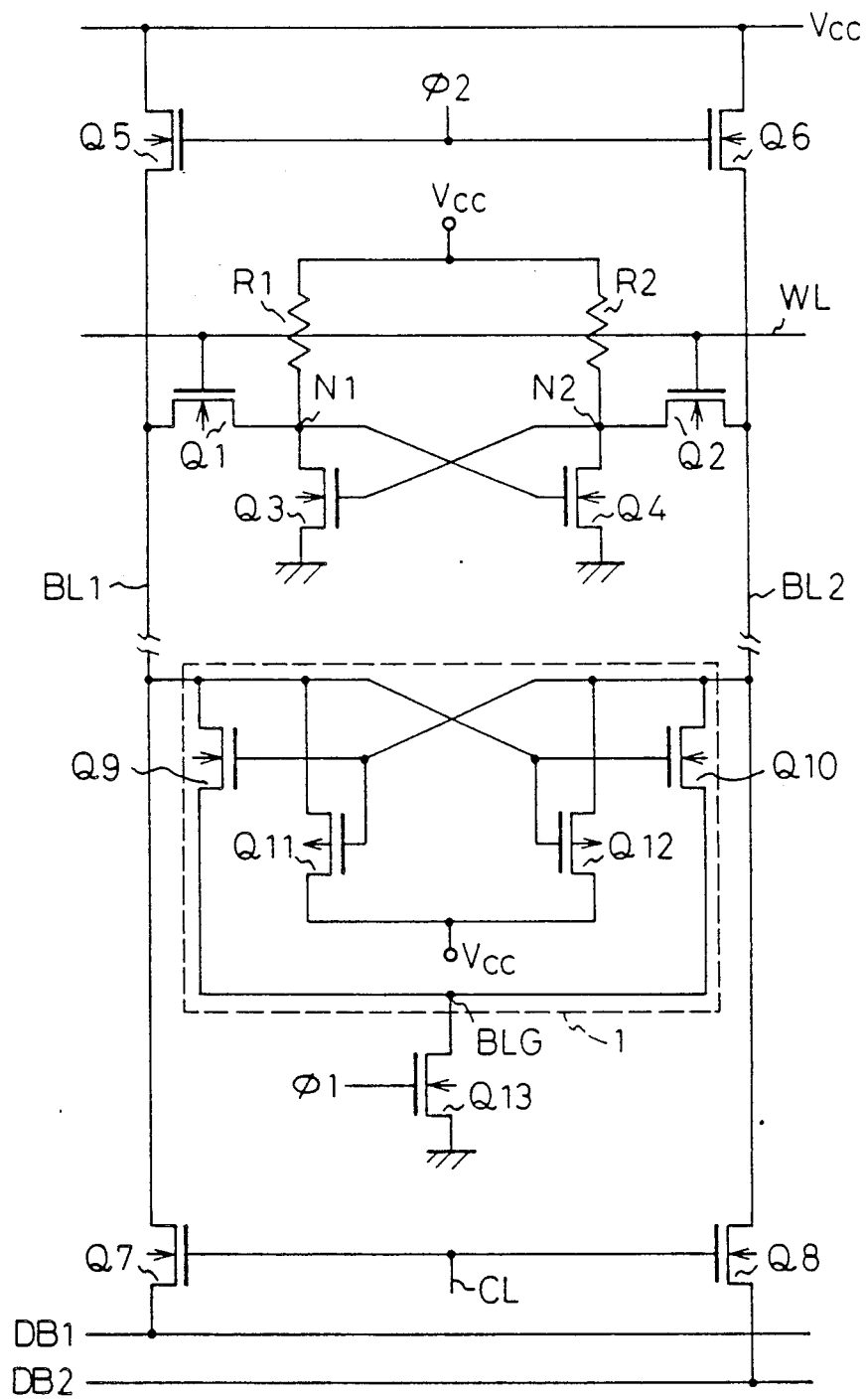
FIG. 6 is a circuit diagram illustrating a modification of the embodiment shown in FIG. 4.
Figure 7:
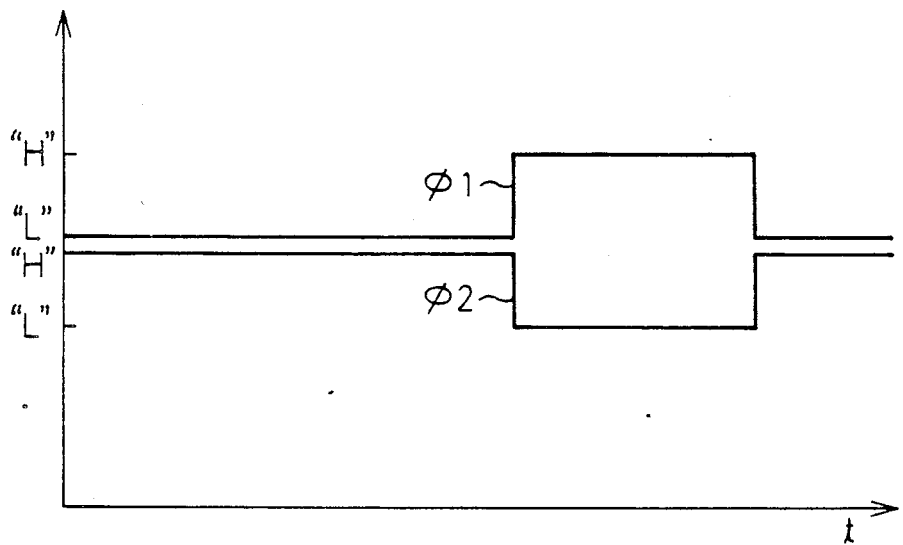
FIG. 7 is a waveform diagram of gate signals employed in each embodiment.

The circuit constitution illustrated in FIG. 6 is characterized in that the gates of the transistors Q5,Q6 are connected to each other and receive a common gate signal 100 2, and that the gate signal 100 2 has a inverse phase to the gate signal $\phi$ 1 applied to the transistor Q13, as shown in FIG. 7. Other circuit constitution and the operation thereof are the same as those in FIG. 4 and, accordingly, the explanation thereof will be omitted. According to the constitution of FIG. 6, when the transistor Q13 is turned ON, the transistors Q5,Q6 are cut OFF and the bit lines BL1,BL2 are electrically separated from the power supply line Vcc. As a result, it is possible to prevent the above direct current from flowing an thus to decrease the power dissipated.

The gate signals $\phi$ 1, $\phi$ 2 can be given, for example, by providing input terminals for exclusive use thereof on the SRAM chip and feeding the signals via the input terminals from the burn-in apparatus. Without providing the exclusive input terminals, however, other terminals provided on the chip may be utilized for inputting the gate signals $\phi$ 1, $\phi$ 2. An example of the latter circuit constitution is shown in FIG. 8, and waveforms of input/output signals therein are shown in FIGS. 9A to 9C.

Figure 8:
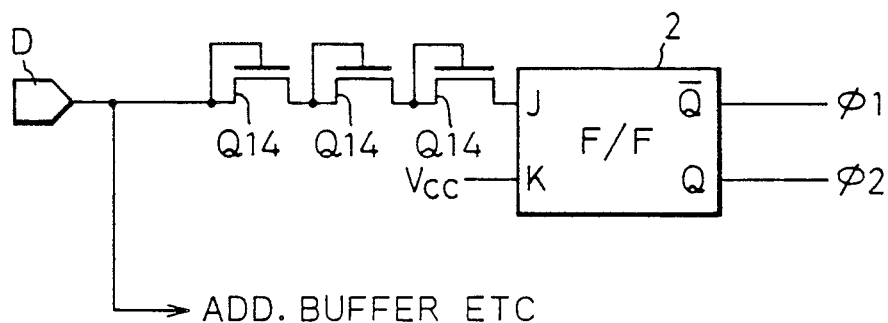
FIG. 8 is a circuit diagram illustrating a constitution of a circuit for generating gate signals shown in FIG. 7.
Figure 9A:
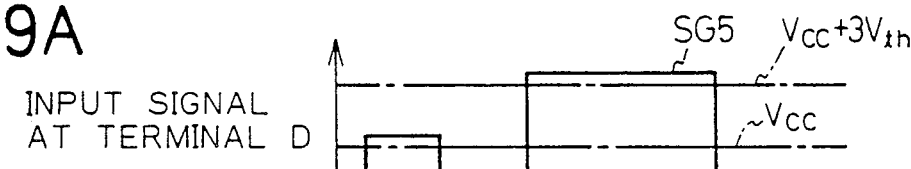
FIGS. 9A to 9C are waveform diagrams of input/output signals in the circuit of FIG. 8.
Figure 9B:
Figure 9C:
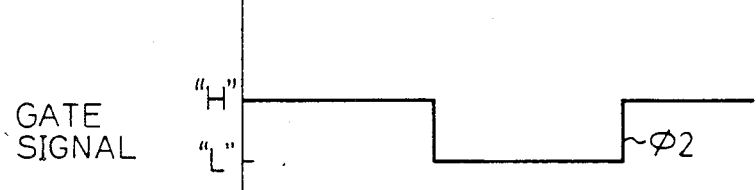

In FIG. 8, reference 2 denotes a J-K type flipflop (F/F) provided within the identical SRAM chip. An input terminal J of the F/F 2 is connected via three serially-connected transistors Q14 to a terminal D, which is also used for the input/output of an other signal, e.g., and address signal. The gate of each transistor Q14 is connected to a source/drain thereof. Also, another input terminal K of the F/F 2 receives the power supply voltage Vcc. According to this constitution, as shown in FIGS. 9A to (c, when an input signal SG5 of a potential exceeding the voltage Vcc plus 3 Vth (Vth is a threshold voltage of each transistor Q14) is input into the terminal D, and the F/F 2 can output the gate signals $\phi$ 2, $\phi$ 1 having an inverse phase at a pair of output terminals Q,Q, respectively.

Figure 10:
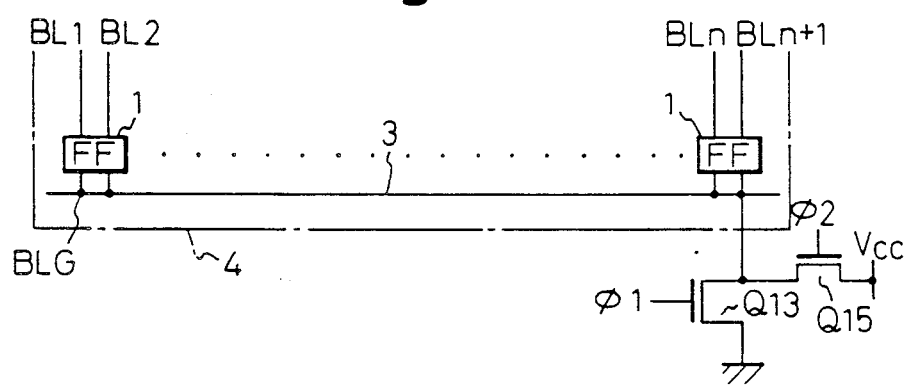
FIG. 10 is a circuit diagram illustrating a constitution of part of another embodiment of the present invention.

Although, in the above embodiments, the transistor Q13 is provided on a one-to-one basis for each column in the SRAM device, it is not restrictive. For example, as shown in FIG. 10, the connection points BLG at each column can be connected to a common line 3, which is connected to the transistor Q13 at an end portion of a cell block 4. Also, provision of a transistor Q15 responsive to the above gate signal $\phi$ 2 between the power supply line Vcc and the drain of the transistor Q13 produces an advantage in that, when the transistor Q13 is turned OFF and the transistor Q15 is simultaneously turned ON, the potential on the common line 3 is promptly raised to "H" level and the potential difference between each of the pairs of bit lines BL1,BL2; . . . ; BLn,BLn+1 is quickly returned to the normal potential difference at which the read/write operation is carried out.

Figure 11:
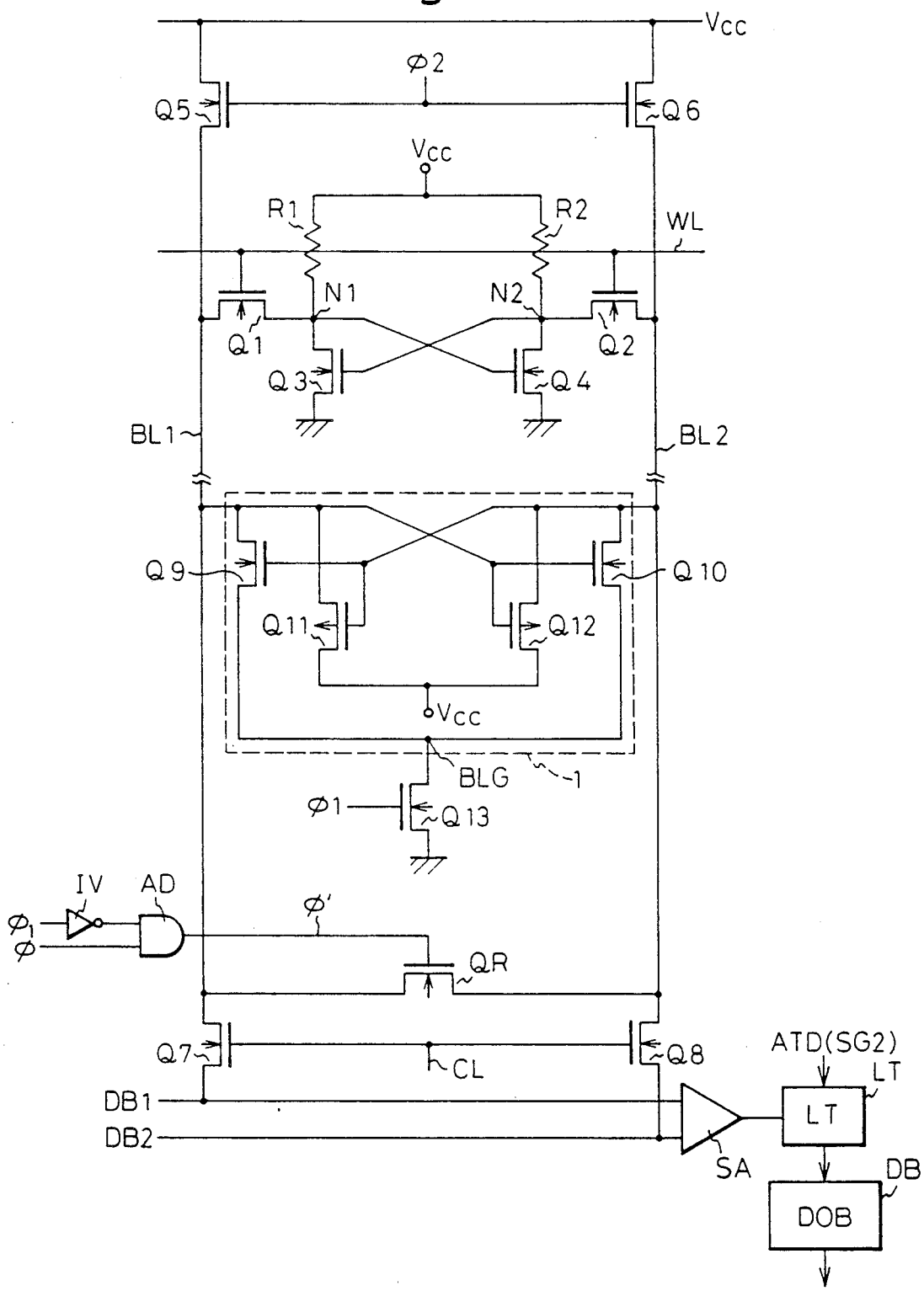
FIG. 11 is a circuit diagram illustrating another modification of the embodiment shown in FIG. 4.

FIG. 11 illustrates a circuit constitution of another modification of the embodiment shown in FIG. 4.

As compared with the constitution of FIG. 6 illustrating one modification of the embodiment of FIG. 4. The constitution of FIG. 11 further includes: a transistor QR connected between the pair of bit lines BL1,BL2 and responsive to a reset signal $\phi'$; an inverter IV responsive to the gate signal $\phi$ 1; an AND gate AD responsive to an output of the inverter IV and a control signal $\phi$ and generating the reset signal $\phi'$; a sense amplifier SA for amplifying the data output on the pair of data bus lines DB1,DB2; a latch (LT) LT responsive to the ATD signal SG2 (see FIG. 5B) and latching an output of the sense amplifier SA; and a data output buffer (DOB) DB for effecting a buffering of data output from the latch LT.

According to the illustrated constitution, when the gate gate signal 100 1 is at "H" level, the output $\phi'$ of the AND gate AD is fixed "L" level. As a result, the transistor QR is cut OFF and the bit lines BL1,BL2 are electrically separated from each other. On the other hand, when the gate gate signal $\phi$ 1 is at "L" level, the output $\phi'$ of the AND gate AD is raised to "H" level in response to the control signal φ of "H" level. In this case, the transistor QR is turned ON and each potential of the bit lines BL1,BL2 is equalized.

Therefore, when the screening test (burn-in test) is not carried out. i.e., when the gate signal φ 1 is at "L" level, it is possible to equalize the potentials of the bit lines BL1.BL2 by raising the control signal φ to "H" level at a suitable timing and, for example, to promptly prepare the next reading of information. In this case, the suitable timing is selected at a time immediately after a memory cell is selected and information is read out from the selected cell. Thus, according to the constitution of FIG. 11, it is possible to realize a reliable rejection of a "no good" device as in each embodiment shown in FIGS. 4 and 6 and, furthermore, to realize a high speed read operation.

Although the present invention has been disclosed and described by way of various embodiments, it is apparent to those skilled in the art that other embodiments and modifications of the present invention are possible without departing from the spirit or essential features thereof.

I claim:

1. A semiconductor memory device comprising:
   a pair of bit lines;
   a memory cell provided between said pair of bit lines, said bit lines having a potential difference therebetween when information stored in said memory cell is read out; and
   a potential difference control means operably connected to said pair of bit lines, responsive to a first control signal and increasing a potential difference between said pair of bit lines to a predetermined level higher than the potential difference appearing therebetween in the read operation of said information.

2. A device as set forth in claim 1, wherein said potential difference control means further includes a flip-flop circuit, and two input/output nodes thereof being connected to said pair of bit lines, respectively, wherein said transistor control means responsive to said first control signal activates said flip-flop circuit to increase the potential difference between said pair of bit lines up to said predetermined level.

3. A device as set forth in claim 2, wherein said predetermined level is substantially equal to a potential difference between a potential on a power supply line and a ground potential.

4. A device as set forth in claim 3, further comprising first and second transistors connected between said power supply line and said pair of bit lines, respectively, each gate of said first and second transistors being connected to said power supply line.

5. A device as set forth in claim 3, further comprising first and second transistors connected between said power supply line and said pair of bit lines, respectively, each gate of said pair of bit lines, respectively, each gate of said first and second transistors receiving a second control signal having an inverse phase to said first control signal.

6. A device as set forth in claim 5, further comprising means for generating said first and second control signals.

7. A device base set forth in claim 5, further comprising a third transistor connected between said pair of bit lines and equalizing each potential of said pair of bit lines in response to a third control signal.

8. A device as set forth in claim 7, further comprising means for generating said third control signal in said read operation of information.

9. A device as set forth in claim 3, wherein said control means is a first n-channel transistor.

10. A device as set forth in claim 9, wherein said first n-channel transistor and said flip-flop circuit are provided on a one-to-one basis.

11. A device as set forth in claim 9, comprising a plurality of said flip-flop circuits, said plurality of flip-flop circuits being connected via a common line to a drain of said first n-channel transistor, a source of said first n-channel transistor being grounded.

12. A device as set forth in claim 11, further comprising a second n-channel transistor, said second n-channel transistor being connected between said power supply line and the drain of said first n-channel transistor and responsive to a second control signal having an inverse phase to said first control signal.

13. A device as set forth in claim 9, wherein said flip-flop circuit is constituted by two pairs of transistors, each pair being constituted by a p-channel transistor and an n-channel transistor connected in series between said power supply line and a drain of said first n-channel transistor, each gate of one pair of transistors being connected to each drain of another pair of transistors.

14. A device as set forth in claim 1, wherein said memory cell is a static random access memory cell.

15. A semiconductor memory device having a pair of bit lines and a memory cell provided between said pair of bit lines, said semiconductor memory device comprising:
   a potential difference regulating means operably connected to said pair of bit lines and, when said memory cell is selected based on an address signal, and information in said memory cell is read out via said pair of bit lines, reducing a potential difference between said pair of bit lines to a first predetermined level, the predetermined level being equal to a potential difference appearing between the pair of bit lines in the normal read operation,
   wherein said potential difference regulating means responds to a first control signal and increases a potential difference between said pair of bit lines to a level higher than said predetermined level.

16. A semiconductor memory device comprising:
   a pair of bit lines;
   a memory cell provided between said pair of bit lines, said bit lines having a potential difference therebetween when information stored in said memory cell is read out; and
   a potential difference control means, operably connected to said pair of bit lines, for increasing said potential difference between said pair of bit lines up to a predetermined level in response to a first control signal; and
   first and second transistors connected between a power supply line and said pair of bit lines, respectively, each gate of said first and second transistors being connected to said power supply line.

17. A semiconductor memory device comprising:
   a pair of bit lines;
   a memory cell provided between said pair of bit lines, said bit lines having a potential difference therebetween when information stored in said memory cell is read out;
   a potential difference control means, operably connected to said pair of bit lines, for increasing said potential difference between said pair of bit lines up to a predetermined level in response to a first control signal ;and first and second transistors connected between a power supply line and said pair of bit lines, respectively, each gate of said first and second transistors receiving a second control signal having a phase inverse to said first control signal.

* * * * *